(12) United States Patent
Zhao et al.

(10) Patent No.: US 10,685,811 B2
(45) Date of Patent: Jun. 16, 2020

(54) SWITCHABLE MATCHING NETWORK AND AN INDUCTIVELY COUPLED PLASMA PROCESSING APPARATUS HAVING SUCH NETWORK

(71) Applicant: Advanced Micro-Fabrication Equipment Inc. China, Shanghai (CN)

(72) Inventors: Kui Zhao, Shanghai (CN); Hiroshi Iizuka, Shanghai (CN); Tuqiang Ni, Shanghai (CN); Xiaobei Pang, Shanghai (CN)

(73) Assignee: ADVANCED MICRO-FABRICATION EQUIPMENT INC. CHINA, Shanghai (CN)

( * ) Notice: Subject to any disclaimer, the term of this patent is extended or adjusted under 35 U.S.C. 154(b) by 0 days.

(21) Appl. No.: 16/387,438

(22) Filed: Apr. 17, 2019

(65) Prior Publication Data
US 2020/0090908 A1    Mar. 19, 2020

(30) Foreign Application Priority Data

Sep. 13, 2018   (CN) .......................... 2018 1 1065920

(51) Int. Cl.
*H01J 37/32*    (2006.01)
*H03H 7/40*    (2006.01)

(52) U.S. Cl.
CPC ..... *H01J 37/32183* (2013.01); *H01J 37/3211* (2013.01); *H03H 7/40* (2013.01)

(58) Field of Classification Search
None
See application file for complete search history.

(56) References Cited

U.S. PATENT DOCUMENTS

2011/0030900 A1*  2/2011  Chen ................ H01J 37/32091
                                                            156/345.48

FOREIGN PATENT DOCUMENTS

CN           107710607 A      2/2018

* cited by examiner

*Primary Examiner* — Jany Richardson
(74) *Attorney, Agent, or Firm* — Womble Bond Dickinson (US) LLP; Joseph Bach, Esq.

(57) ABSTRACT

A switchable matching network and an inductively coupled plasma processing apparatus having such network are disclosed. The switchable matching network enables selection between two bias power frequencies. The network is particularly suitable for an inductively-coupled plasma processing apparatus. The switchable matching network comprises: a first match circuit having a first input port connected to a first signal source and a first output port coupled to a load; a second match circuit having a second input port connected to a second signal source and a second output port coupled to the load; a switching device having a first connection port, a second connection port and a third connection port, the first connection port connected to the first input port and the second connection port connected to the second output port; a variable capacitor connected between ground and the third connection port of the switching device.

21 Claims, 2 Drawing Sheets

SWITCHABLE MATCHING NETWORK AND AN INDUCTIVELY COUPLED PLASMA PROCESSING APPARATUS HAVING SUCH NETWORK

RELATED APPLICATION

The present application claims priority to and the benefit of Chinese Patent Application No. 201811065920.6, filed on Sep. 13, 2018, and the disclosure of which is hereby incorporated herein by reference in its entirety.

BACKGROUND

1. Field

This disclosure relates generally to the field of RF matching networks and, especially to RF matching networks used in plasma processing apparatus.

2. Related Art

Plasma chambers utilizing dual or multiple RF frequencies is known in the art. Generally, a plasma processing apparatus of dual frequencies receives RF bias power having frequency below about 15 MHz, and an RF source power at higher frequency, normally 27-200 MHz. In this context, RF bias refers to the RF power which is used to control the ion energy and ion energy distribution. On the other hand, RF source power refers to RF power which is used to control the plasma ion dissociation or plasma density. For example, in an inductively coupled plasma processing apparatus the RF source power is applied to an antenna and is used to ignite and sustain the plasma, while the RF bias power is applied to the chuck to control the energy at which ions bombard the substrate. For some specific examples, it has been known to operate plasma etch chambers at, e.g., bias RF of 100 KHz, 2 MHz, 2.2 MHz or 13.56 MHz, and source RF at 13.56 MHz, 27 MHz, 60 MHz, 100 MHz, and higher.

In general, a plasma processing apparatus is constructed with a set of frequency combination for the RF bias and source RF powers. However, different frequencies lead to different plasma characteristics, for instance, ion energy distribution, and thus it is beneficial to have the ability to switch between two different frequencies in a plasma processing apparatus in order to fulfill different requirements in materials processing. For efficient application of bias power it is necessary to utilize an RF matching network that is designed specifically for the operational frequency of bias RF supply. Thus what is needed in the art is an efficiently switchable RF matching network that is selectively operable in two different frequencies.

Accordingly, the problem solved by this invention is the ability to switch RF bias frequencies and provide RF matching network that can efficiently couple either of the RF bias frequencies to the plasma.

SUMMARY OF THE INVENTION

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Disclosed embodiments provide an RF matching network that can efficiently couple either of two different bias frequencies to the plasma.

In some disclosed embodiments the RF matching network is made of two L-type matching circuits, each consisting of two arms, one in series and one in shunt. The shunt arm is common to both L-type matching circuits, but it switchably connects to the input of one of the L-type matching circuits or to the output of the other L-type matching circuits. In disclosed embodiments the common shunted leg is made of a variable capacitor. Also, the shunted arm is connected to the L-type matching circuits designed for operation at a higher frequency than the L-type matching circuits for which the shunted arm connects to the output. In some particular embodiments the shunted arm is connected to the L-type matching circuits designed for operation at 13 MHz, while the shunted arm connects to the output of the L-type matching circuits designed for operation at 400 kHz.

In general aspects, switchable matching network is provided, comprising: a first match circuit having a first input port connected to a first signal source and a first output port coupled to a load; a second match circuit having a second input port connected to a second signal source and a second output port coupled to the load; a selector switch having a base, a first contact and a second contact, the first contact connected to the first input port and the second contact connected to the second output port; and, a variable capacitor connected between ground and the base of the selector switch.

In one embodiment a switchable matching network is provided, switchably coupling one of two RF bias powers to a table, the switchable matching network comprising: a first match circuit having a first input port connected to the first RF bias supply (f1) and a first output port coupled to load port; a second match circuit having a second input port connected to a second RF bias power (f2) and a second output port coupled to the load port; a variable capacitor having one side connected to ground; a switching device selectively connecting the variable capacitor to either the first input port or the second output port.

Disclosed embodiments include an inductive plasma processing apparatus having switchable bias, comprising: a vacuum chamber; a source RF supply; a first RF bias supply; a second bias supply; an inductive antenna coupled to the source RF supply; a table positioned inside the vacuum chamber and switchably coupled to the first RF bias supply and to the second RF bias supply via a switchable matching network; the switchable matching network comprising: a first match circuit having a first input port connected to the first bias power supply and a first output port coupled to the table; a second match circuit having a second input port connected to a second bias power supply and a second output port coupled to the first output port; a variable capacitor having one side connected to ground; and, a switching device selectively connecting the variable capacitor to either the first input port or the second output port.

Compared with the prior art, the beneficial technical effect is that: the present invention designs a RF matching network for work frequencies, provides a RF matching network which operates in two different frequencies and is switchable efficiently. The RF matching network applies bias power, switches bias frequency and provides a RF matching network which can efficiently couple either of bias frequency to the plasma.

BRIEF DESCRIPTION OF THE DRAWINGS

Other aspects and features of the invention would be apparent from the detailed description, which is made with reference to the following drawings. It should be appreciated that the detailed description and the drawings provides various non-limiting examples of various embodiments of the invention, which is defined by the appended claims.

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

DETAILED DESCRIPTION

Embodiments of the inventive switchable matching network will now be described with reference to the drawings. Different embodiments or their combinations may be used for different applications or to achieve different benefits. Depending on the outcome sought to be achieved, different features disclosed herein may be utilized partially or to their fullest, alone or in combination with other features, balancing advantages with requirements and constraints. Therefore, certain benefits will be highlighted with reference to different embodiments, but are not limited to the disclosed embodiments. That is, the features disclosed herein are not limited to the embodiment within which they are described, but may be "mixed and matched" with other features and incorporated in other embodiments.

Disclosed embodiments include a matching network having two RF matching circuits wherein a variable capacitor is connected to either of the RF matching circuits via switching device. As will be demonstrated in the embodiments below, one feature of the matching network is that the switching device couples the variable capacitor to the input of one RF matching circuit but to the output of the other RF matching circuit. In that sense, the matching network utilizes two asymmetrical RF matching circuits. Such a matching network has been found to be particularly effective for coupling bias power to the table of an inductively coupled plasma processing apparatus.

Figure 1:
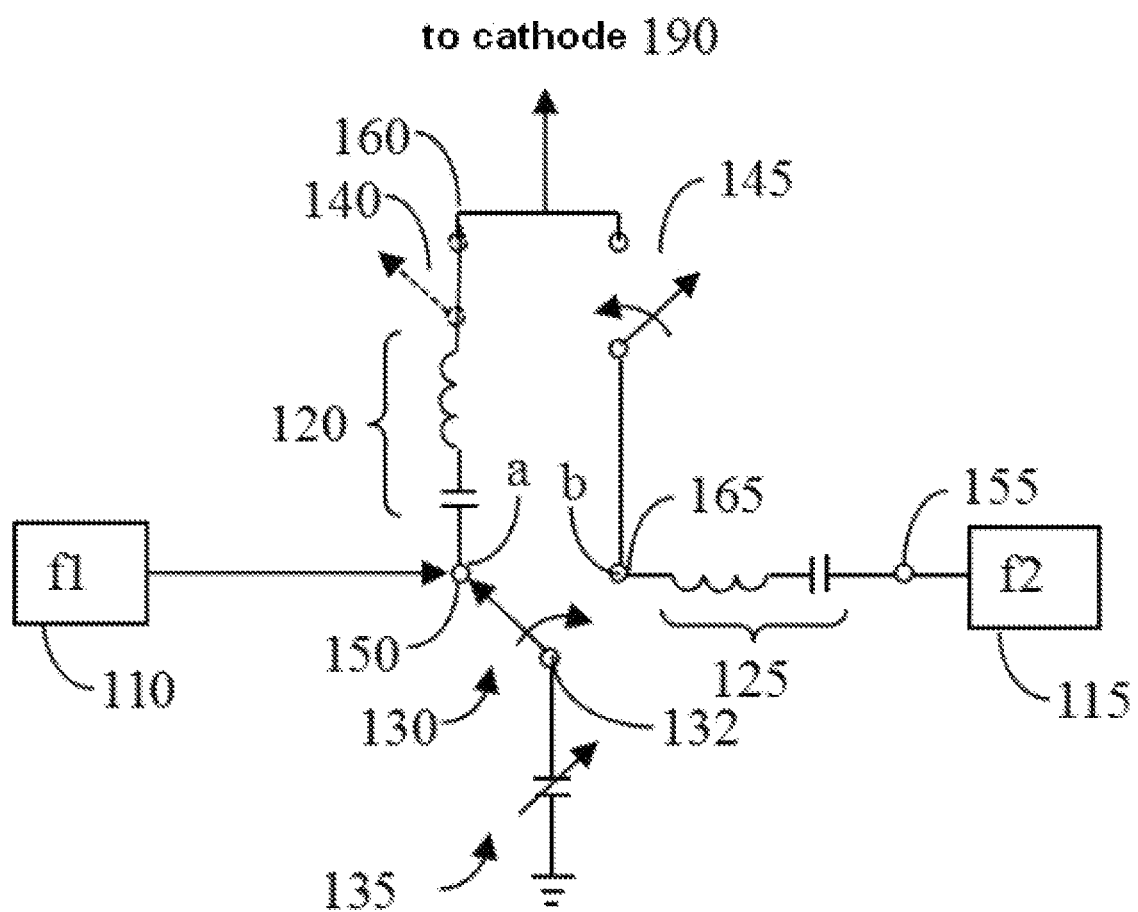
FIG. 1 illustrates a switchable matching network according to an embodiment of the invention.

FIG. 1 illustrates a switchable matching network according to disclosed embodiment, utilizing two L-type matching circuits. The embodiment will be described with respect to applying one of two available RF bias powers to a table or a cathode of a plasma processing apparatus. A first RF bias power supply 110 outputs RF power at a first frequency f1. A second RF bias power supply 115 outputs RF power at a second frequency f2, which is lower than the first frequency, f1. For example, f1 may be higher than 2 MHz, or higher than 10 MHz, or higher than 13 MHz, e.g., 13.56 MHz, or even may reach to 60 MHz, while f2 may be selected from 100 kHz up to 2 MHz, e.g., 400 KHz. In this manner, the plasma may be ignited and sustained by a separate mechanism, e.g., an inductively coupled source using inductive antenna to feed source power into the plasma processing apparatus by means of inductively coupling. The ion bombardment is then controlled by selecting either f1 or f2 as the bias power. In the present application, the ratio of the first RF bias frequency and the second RF bias frequency is huge and at least equals to 2 MHz:100 kHz=20, typical equals to 13.56 MHz:400 kHz=33. The huge ratio of two frequencies of RF bias source can implement different control of plasma energy in the plasma processing by selecting output power of different RF bias supplies, and at the same time the load impedances in the vacuum chamber will vary widely when the first and second RF bias supply is selectively output to a table (or a cathode) in the vacuum chamber, wherein the load impedance produced in the vacuum chamber by a 400 kHz RF bias supply is about several hundred ohms, and the load impedance produced in the vacuum chamber by a 13.56 MHz RF bias supply is about several ohms. In the prior art of matching circuits, it is impossible to use a common variable capacitor to match two RF bias supplies having two frequencies differ significantly as used in the present application.

FIG. 1 shows a switchable matching network according to one embodiment of the invention. An L-type match circuit generally has a serial leg and a shunt leg. The matching network shown in FIG. 1 has a first matching circuit made out of serial leg 120 and a second matching circuit made out of serial leg 125. In this example the serial legs 120 and 125 separately include a serially connected inductor and capacitor. The shunt leg of both matching circuits is made up of the same variable capacitor 135, which is switchably connected to either of serial leg 120 or serial leg 125. However, the application of the shunt leg is done asymmetrically, i.e., when the variable capacitor 135 is connected to serial leg 120, it is connected to the input side of the leg; conversely, when the variable capacitor 135 is connected to serial leg 125, it is connected to the output side of the leg. Such an asymmetrical connection has been found to improve coupling of RF bias power to plasma processing apparatus.

In the example of FIG. 1, the variable capacitor 135 is connected between ground and the base 132 of a selector switch 130. The switching device disclosed in the invention comprises a selector switch 130 having a first connection port, a second connection port and a third connection port. The base 132 is equivalent to the third connection port, a first contact is equivalent to the first connection port and a second contact b is equivalent to the second connection port. Switch 130 can be toggled between two taps. When the selector switch 130 is toggled to a first tap (tap a) connected to the input side of serial leg 120, a coupling switch 145 is placed in the open position. Under this condition only the first matching circuit is engaged, such that bias power from the first RF bias supply 110 is applied to the cathode 190. Conversely, if the selector switch 130 is toggled to the second tap (tap b) and the coupling switch 145 is switched to the closed position, then the second matching circuit is engaged and the bias power from a second RF bias supply 115 is applied to the cathode 190. The first match circuit is connected between a signal source and a table so as to apply a first RF signal to the cathode. The second match circuit is connected between a second signal source and a table so as to apply a second RF signal to the cathode. The first RF bias supply 110 is applied as the first signal source and the second RF bias supply 115 is applied as the second signal source. In this condition, optionally coupling switch 140 can be added and switched to the open position, as shown in dotted line.

Thus, the matching network of FIG. 1 utilizes variable capacitor 135 for both the first and second matching circuits.

When the selector switch 130 is at its first tap a, the variable capacitor 135 forms an L-type matching circuit with the serial leg 120, wherein the variable capacitor 135 is connected on matching circuit's input side. When the variable switch 130 is at its second tap b, the variable capacitor 135 forms an L-type matching circuit with the serial leg 125, wherein the variable capacitor 135 is connected on the matching circuit's output side.

Since when the first RF bias supply 110 is applied to cathode 190 the impedance at the input end of a serial leg 120 is higher than that at the output end of the serial leg 120, only when the variable capacitor 135 is connected to the input end of the serial leg 120 can it implement the effective impedance matching. When the second RF bias supply 115 whose frequency is lower than 2 MHz is applied to cathode 190, the load impedance at the cathode is about several hundred ohms, which is larger than the impedance at the input end of the serial leg 125. Therefore, for the effective adjustment of RF match circuit, the variable capacitor 135 is connected to the output end of serial leg 125. The disclosed RF matching network utilizes a common variable capacitor 135 to selectively connect with a serial legs 120 and 125, satisfying the requirement of matching with two RF bias supplies and enabling to apply RF bias supply with different frequencies (frequency ratio>20) in one plasma processing apparatus according to different process.

In the present invention, RF bias supplies with different frequencies are connected to the different ends of the serial legs 120 and 125, which enables a common variable capacitor 135 to match two RF power with frequencies differ significantly and two RF bias power supply to the bottom electrode inside the vacuum chamber effectively.

The embodiment of FIG. 1 provides a switchable matching network, comprising: a serial leg 120 and a variable capacitor 135 having a first input port 150 connected to a first RF bias supply 110 and a first output port 160 coupled to a cathode 190 (i.e. a load of plasma vacuum chamber) in a table; a serial leg 125 and a variable capacitor 135 having a second input port 155 connected to a second RF bias supply 115 and a second output port 160 coupled to a cathode 190 (i.e. a load of plasma vacuum chamber) in a table; a selector switch 130 having a base 132, a first contact (tap a) and a second contact (tap b), the first contact (a) connected to the first input port 150 and the second contact (b) connected to the second output port 165; and, a variable capacitor 135 connected between ground and the base 132 of the selector switch 130.

In the embodiments disclosed, the second match circuit is configured to operate at RF signal at 100 KHz to 2 MHz and the first match circuit operates at frequency higher than the second match circuit. Also, a coupling switch 145 may be connected between the second output port and the load to isolate the second match circuit when the first match circuit is engaged. Optionally, another coupling switch 140 can be connected between the first output port and the load to similarly isolate the first match circuit when the second match circuit is engaged.

The disclosed selector switch 130 can be a switch comprising three ports and selectively connecting a variable capacitor 135 with a first contact (a) and second contact (b), or can be consist of two switches, one end of each switch connecting to a variable capacitor 135 and the other end of each switch respectively connecting to the input end of a first match circuit and the output end of a second match circuit. Therefore, the disclosed switching device is configured to switch between the variable capacitor and two match circuits, not limited to a three-end switch and can be a switch device in any forms.

Figure 2:
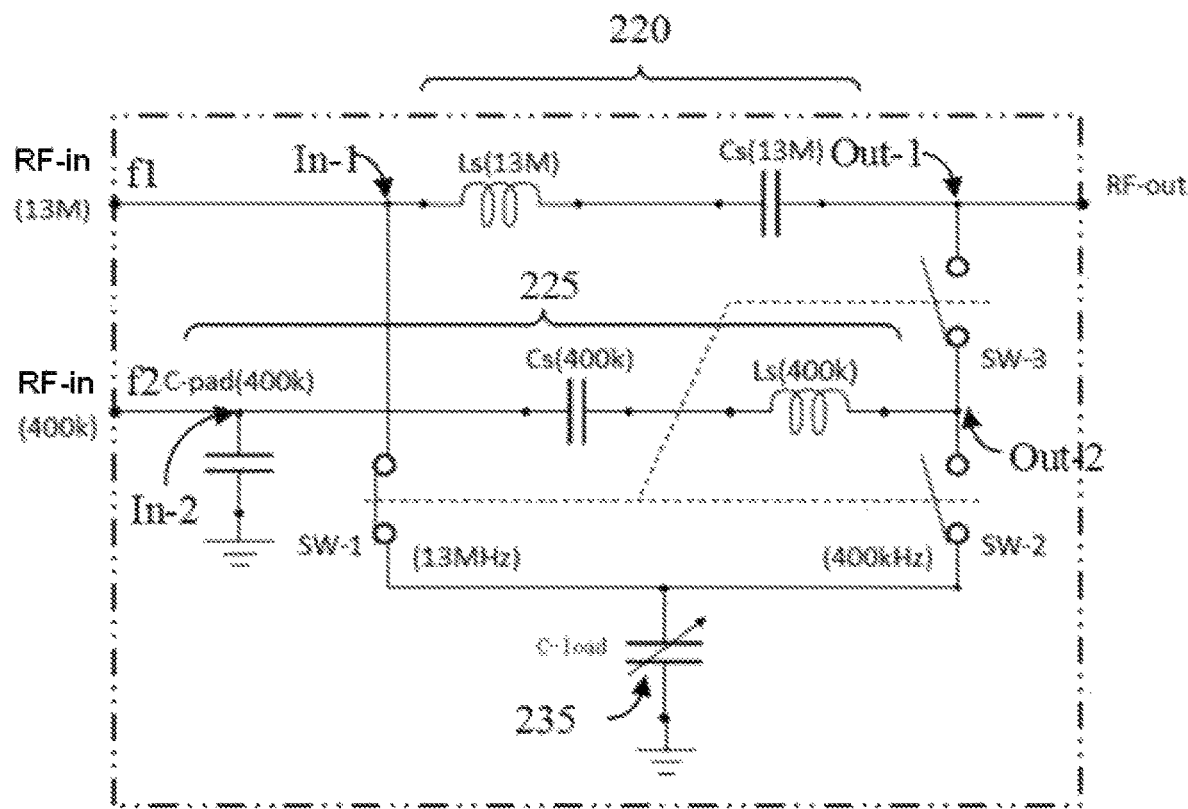
FIG. 2 illustrates another matching network according to another embodiment.

Another embodiment is illustrated in FIG. 2, which provides an example of a matching network for a first RF bias at 13 MHz and a second RF bias at 400 kHz. Elements forming the first match circuit are identified with (13M), while elements forming the second match circuit are identified with (400 k). The first matching circuit is formed by serial leg 220 together with shunt capacitor 235. The second matching circuit is formed by serial leg 225 together with shunt capacitor 235. In this embodiment the serial leg 220 is made up of a serially connected capacitor Cs (13M) and inductor Ls (13M), while the second serial leg 225 is made up of a serially connected capacitor Cs (400 k) and inductor Ls (400 k), and a shunt capacitor C-pad (400 k). The fixed capacitor C-pad (400 k) protects shunt capacitor 235 from high RF currents when variable capacitor 235 is connected to the second match circuit.

The embodiment illustrated in FIG. 2 provides a switchable matching network, switchably coupling one of two RF bias powers to a table, the switchable matching network comprising: a serial leg 220 having a first input port (In-1) connected to the first RF bias supply (f1) and a first output port (Out-1) coupled to load port (RF-out); a serial leg 225 having a second input port (In-2) connected to a second RF bias power (f2) and a second output port (Out 2) coupled to the load port; a variable capacitor (235) having one side connected to ground; a coupling switch (SW-1, SW-2, SW-3) selectively connecting the variable capacitor 235 to either the first input port (In-1) or the second output port (Out-2).

The switching device of FIG. 2 comprises: a coupling switch (SW-1) connected between the first input port (In-1) and the variable capacitor (235), and a second coupling switch (SW-2) connected between the second output port (Out-2) and the variable capacitor 235. As with other embodiments, a coupling switch (SW-3) may be connected between the second output port (Out-2) and the first output port (Out-1). A fixed capacitor (C-pad, 400 k) may be connected between the second input port (In-2) and ground, serving to protect variable capacitor 235.

Figure 3:
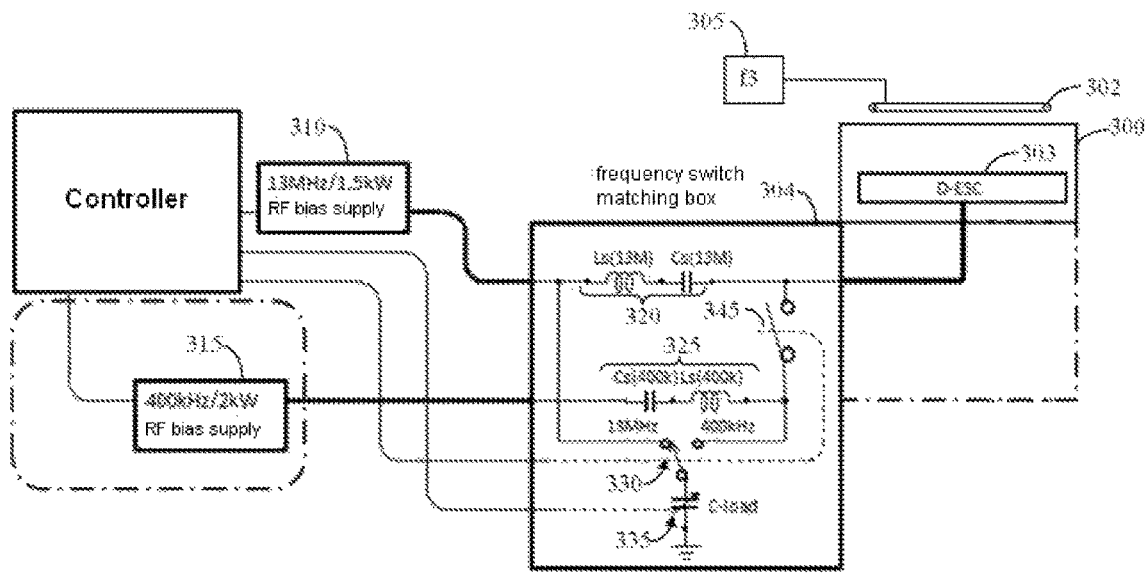
FIG. 3 illustrates a switchable matching network coupled to a plasma processing apparatus, according to an embodiment of the invention.

FIG. 3 illustrates the switchable matching network coupled to a plasma processing apparatus, according to an embodiment of the invention. The plasma processing apparatus includes a vacuum chamber 300 having a table 303 upon which a wafer is placed. Plasma is ignited and maintained inside the vacuum chamber 300 by application of RF power from source RF supply 305 onto an antenna 302. The RF frequency of RF supply 305 is f3. The bias power is applied to the table 303 through the switchable dual frequency matching box 304. The switchable dual frequency matching box 304 selectively applies either the signal from RF generator 310 or the signal from RF generator 315.

The circuitry construction of switchable dual frequency matching box 304 can be implemented according to any of the embodiments described herein, and in the example of FIG. 3 the circuitry of the embodiment of FIG. 1 is shown. The switches 330 and 345 are controlled by a controller, which activates switch 330 to connect to tap (a) and switch 345 to assume the closed position for engaging a first matching circuit 320, and controls switch 330 to connect to tap (b) and switch 345 to assume the closed position to engage a second matching circuit 325. As shown in this example, RF generator 110 provides a signal at 13 MHz, while RF generator 315 provides a signal at 400 kHz.

As disclosed, the embodiment of FIG. 3 provides an inductively coupled plasma processing apparatus having switchable bias, comprising: a vacuum chamber 300; a source RF supply 305; a first RF bias supply 310; a second RF bias supply 315; an inductive antenna 302 coupled to the source RF supply; a table 303 positioned inside the vacuum chamber and switchably coupled to the first RF bias supply and to the second RF bias supply via a switchable matching network; a cathode inside the table 303 and coupling to the output end of the dual frequency matching box 304; the switchable matching network comprising: a first match circuit 320 having a first input port connected to the first RF bias supply 310 and a first output port coupled to the table 303; a second match circuit 325 having a second input port connected to a second RF bias supply 315 and a second output port coupled to the first output port; a variable capacitor 335 having one side connected to ground; and, a selector switch 330 selectively connecting the variable capacitor to either the first input port or the second output port.

In the present invention, RF bias supplies with different frequencies are connected to the different input ends of the different match circuits via a switching device, which enables a switchable matching network to effectively match several RF bias supplies. For a capacitively coupled plasma processing apparatus, a bottom electrode is electrically coupled with an upper electrode. Thus, RF energy generated by a bias RF supply and transmitted to the bottom electrode is simultaneously coupled to the above upper electrode, and the power of the bias RF supply controls the ion energy and has impact on ion density distribution as well. In order to avoid the interference of two RF bias supplies, the frequency of the RF bias supply should be selected very low, i.e. 2 MHz or below, while the output frequency of the source RF supply is generally higher than 27 MHz. The present is applied to an inductively coupled plasma processing apparatus. The plasma density in the processing apparatus is only influenced by the output power of the above source RF supply, and thus several bias RF supplies do not influence the above ion density and gas dissociation but the ion energy, implementing the independent control of the ion density and ion energy. Therefore, the output frequency of the RF bias supply may be higher than 2 MHz, may adopt 13.56 MHz or higher, i.e. 60 MHz. According to specific process requirement, when ion energy incident to a wafer downwardly is extremely high, it needs extremely low output frequency of RF bias supply, i.e. lower than 1 MHz. The switchable matching network provided herein may enable two RF bias supplies with significantly different frequency values to feed the RF powers to a table effectively.

It should be understood that processes and techniques described herein are not inherently related to any particular apparatus and may be implemented by any suitable combination of components. Further, various types of general purpose devices may be used in accordance with the teachings described herein. The present invention has been described in relation to particular examples, which are intended in all respects to be illustrative rather than restrictive. Those skilled in the art will appreciate that many different combinations will be suitable for practicing the present invention.

Moreover, other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

The invention claimed is:

1. A switchable matching network, comprising:
    a first matching circuit having a first input port connected to a first signal source and a first output port coupled to a load;
    a second matching circuit having a second input port connected to a second signal source and a second output port coupled to the load;
    a switching device having a first connection port, a second connection port, and a third connection port, wherein the first connection port is directly connected to the first input port, and the second connection point is directly connected to the second output port; and
    a variable capacitor connected between ground and the third connection port of the switching device.

2. The switchable matching network according to claim 1, wherein the second matching circuit operates at a frequency lower than the first matching circuit.

3. The switchable matching network according to claim 1, wherein the second matching circuit is configured to operate at an RF frequency ranging from 100 KHz to 2 MHz, and the first matching circuit operates at a frequency higher than the second matching circuit.

4. The switchable matching network according to claim 1, further comprising a coupling switch connected between the second output port and the load.

5. The switchable matching network according to claim 4, further comprising a switch connected between the first output port and the load.

6. The switchable matching network according to claim 1, wherein each of the first matching circuit and the second matching circuit comprises a capacitor and an inductor which are connected in series.

7. An apparatus for supplying bias powers to cathode of a plasma processor, comprising:
    a first RF bias supply;
    a second RF bias supply;
    a switchable matching network, switchably coupling one of the first RF bias supply and the second RF bias supply to the cathode, the switchable matching network comprising:
    a first matching circuit having a first input port connected to the first RF bias supply and a first output port coupled to the cathode;
    a second matching circuit having a second input port connected to the second RF bias supply and a second output port coupled to the cathode;
    a variable capacitor having one terminal grounded; and
    a switching device, selectively connecting the variable capacitor directly to the first input port or directly to the second output port.

8. The apparatus for supplying bias powers to cathode of a plasma processor according to claim 7, further comprising a coupling switch connected between the second output port and the first output port.

9. The apparatus for supplying bias powers to cathode of a plasma processor according to claim 8, wherein the switching device comprises a selector switch having a base, a first contact, and a second contact, the base being connected to the variable capacitor, the first contact being connectable to the first input port, and the second contact being connectable to the second output port.

10. The apparatus for supplying bias powers to cathode of a plasma processor according to claim 8, wherein the switching device comprises: a first on/off switch connected between the first input port and the variable capacitor, and a second on/off switch connected between the second output port and the variable capacitor.

11. The apparatus for supplying bias powers to cathode of a plasma processor according to claim 8, further comprising a fixed capacitor connected between the second input port and ground.

12. The apparatus for supplying bias powers to cathode of a plasma processor according to claim 7, wherein an output frequency of the first RF bias supply is higher than an output frequency of the second RF bias supply.

13. The apparatus for supplying bias powers to cathode of a plasma processor according to claim 12, wherein the second RF bias supply outputs a signal at a frequency ranging from 100 KHz to 2 MHz.

14. The apparatus for supplying bias powers to cathode of a plasma processor according to claim 13, wherein the first RF bias supply outputs a signal at a frequency of 13.56 MHz, and the second RF bias supply outputs a signal at a frequency of 400 KHz.

15. The apparatus for supplying bias powers to cathode of a plasma processor according to claim 7, wherein each of the first matching circuit and the second matching circuit comprises a capacitor and an inductor which are connected in series.

16. An inductive coupling plasma processor having a switchable bias, comprising:
   a vacuum chamber;
   a source RF supply;
   a first RF bias supply;
   a second RF bias supply;
   an inductive antenna coupled to the source RF supply; and
   cathode disposed inside the vacuum chamber and switchably coupled to the first RF bias supply and the second RF bias supply via a switchable matching network;
   the switchable matching network comprising:
   a first matching circuit having a first input port connected to the first RF bias supply and a first output port coupled to the cathode;
   a second matching circuit having a second input port connected to the second RF bias supply and a second output port coupled to the first output port;
   a variable capacitor having one terminal grounded; and
   a switching device selectively connecting the variable capacitor directly to the first input port or directly to the second output port.

17. The inductive coupling plasma processor according to claim 16, further comprising a coupling switch connected between the second output port and the first output port.

18. The inductive coupling plasma processor according to claim 17, wherein the switching device comprises a selector switch having a base, a first contact, and a second contact, the base being connected to the variable capacitor, the first contact being connectable to the first input port, and the second contact being connectable to the second output port.

19. The inductive coupling plasma processor according to claim 17, wherein the switching device comprises: a first on/off switch connected between the first input port and the variable capacitor, and a second on/off switch connected between the second output port and the variable capacitor.

20. The inductive coupling plasma processor according to claim 16, further comprising a fixed capacitor connected between the second input port and ground.

21. The inductive coupling plasma processor according to claim 16, wherein the first bias supply outputs a signal at a frequency greater than 13 MHz, and the second bias supply outputs a signal at a frequency ranging from 100 KHz to 2 MHz.

* * * * *